United States Patent
Braun (10) Patent No.: US 10,756,712 B2
(45) Date of Patent: Aug. 25, 2020

(54) RQL PHASE-MODE FLIP-FLOP

(71) Applicant: Alexander Louis Braun, Baltimore, MD (US)

(72) Inventor: Alexander Louis Braun, Baltimore, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 364 days.

(21) Appl. No.: 15/810,860

(22) Filed: Nov. 13, 2017

(65) Prior Publication Data

US 2019/0149139 A1    May 16, 2019

(51) Int. Cl.
*H03K 3/38*    (2006.01)

(52) U.S. Cl.
CPC ........................ *H03K 3/38* (2013.01)

(58) Field of Classification Search
CPC .......................................... H03K 3/38
See application file for complete search history.

(56) References Cited

U.S. PATENT DOCUMENTS

| | | |
|---|---|---|
| 3,094,685 A | 6/1963 | Crowe |
| 4,360,898 A | 11/1982 | Faris |
| 4,633,439 A | 12/1986 | Harada et al. |
| 4,956,642 A | 9/1990 | Harada |
| 5,233,243 A | 8/1993 | Murphy et al. |
| 5,250,859 A | 10/1993 | Kaplinsky |
| 5,323,344 A | 6/1994 | Katayama et al. |
| 6,104,764 A | 8/2000 | Ohta et al. |
| 6,310,488 B1 | 10/2001 | Hasegawa et al. |
| 6,420,895 B1 | 7/2002 | Herr et al. |
| 6,608,518 B2 | 8/2003 | Furuta et al. |
| 6,734,699 B1 | 5/2004 | Herr et al. |
| 6,756,925 B1 | 6/2004 | Leung et al. |

(Continued)

FOREIGN PATENT DOCUMENTS

| | | |
|---|---|---|
| CN | 101626233 A | 1/2010 |
| CN | 101626234 A | 1/2010 |

(Continued)

OTHER PUBLICATIONS

Canadian Office Action for Application No. 3,017,892 dated Jul. 23, 2019.

(Continued)

*Primary Examiner* — Patrick O Neill
(74) *Attorney, Agent, or Firm* — Tarolli, Sundheim, Covell & Tummino LLP (57) ABSTRACT

A reciprocal quantum logic (RQL) phase-mode flip-flop includes a storage loop and a comparator, each of which includes Josephson junctions (JJs). A data input, provided as a positive or negative single flux quantum (SFQ) pulse, is stored in the storage loop to set the storage loop in a positive or negative state, respectively, effectively biasing an output JJ shared between the storage loop and a comparator. The data input is captured to the output upon the receipt of a logical clock SFQ reciprocal pulse pair to the comparator, when one of the pulses in the pair causes the output JJ to preferentially trigger over an escape junction in the comparator, owing to the output JJ having been biased by current in the storage loop.

20 Claims, 9 Drawing Sheets

(56) References Cited

U.S. PATENT DOCUMENTS

| | | | |
|---|---|---|---|
| 6,781,435 B1 | 8/2004 | Gupta et al. | |
| 7,129,869 B2 | 10/2006 | Furuta et al. | |
| 7,227,480 B2 | 6/2007 | Furuta et al. | |
| 7,501,877 B2 * | 3/2009 | Furuta | H03K 17/92 326/4 |
| 7,554,369 B2 * | 6/2009 | Kirichenko | H03K 23/763 327/117 |
| 7,724,020 B2 | 5/2010 | Herr | |
| 7,786,748 B1 | 8/2010 | Herr | |
| 7,786,786 B2 | 8/2010 | Kirichenko | |
| 7,903,456 B2 | 3/2011 | Kirichenko et al. | |
| 7,944,253 B1 | 5/2011 | Kirichenko | |
| 7,969,178 B2 | 6/2011 | Przybysz et al. | |
| 7,975,195 B1 | 7/2011 | Joshi et al. | |
| 7,975,795 B2 | 7/2011 | Asano | |
| 7,977,964 B2 | 7/2011 | Herr | |
| 7,991,814 B2 | 8/2011 | Filippov et al. | |
| 8,022,722 B1 | 9/2011 | Pesetski et al. | |
| 8,138,784 B2 | 3/2012 | Przybysz et al. | |
| 8,489,163 B2 | 7/2013 | Herr et al. | |
| 8,571,614 B1 | 10/2013 | Mukhanov et al. | |
| 8,611,974 B2 | 12/2013 | Maibaum et al. | |
| 9,355,364 B2 * | 5/2016 | Miller | H03K 19/195 |
| 9,455,707 B2 | 9/2016 | Herr et al. | |
| 9,473,124 B1 | 10/2016 | Mukhanov et al. | |
| 9,543,959 B1 | 1/2017 | Carmean et al. | |
| 9,595,969 B2 | 3/2017 | Miller et al. | |
| 9,595,970 B1 | 3/2017 | Reohr et al. | |
| 9,646,682 B1 | 5/2017 | Miller et al. | |
| 9,712,172 B2 | 7/2017 | Shauck et al. | |
| 9,780,765 B2 | 10/2017 | Naaman et al. | |
| 9,812,192 B1 | 11/2017 | Burnett et al. | |
| 9,864,005 B1 | 1/2018 | Carmean et al. | |
| 9,876,505 B1 | 1/2018 | Dai et al. | |
| 9,887,700 B2 | 2/2018 | Carmean et al. | |
| 9,905,900 B2 | 2/2018 | Herr et al. | |
| 9,917,580 B2 | 3/2018 | Naaman | |
| 9,972,380 B2 | 5/2018 | Ambrose | |
| 10,074,056 B2 | 9/2018 | Epstein | |
| 10,084,454 B1 | 9/2018 | Braun et al. | |
| 10,090,841 B1 | 10/2018 | Herr | |
| 10,103,735 B1 | 10/2018 | Herr | |
| 10,103,736 B1 | 10/2018 | Powell, III et al. | |
| 10,147,484 B1 | 12/2018 | Braun | |
| 10,158,348 B1 | 12/2018 | Braun | |
| 10,158,363 B1 | 12/2018 | Braun | |
| 10,171,087 B1 | 1/2019 | Braun | |
| 10,311,369 B2 | 6/2019 | Epstein | |
| 10,355,696 B1 | 7/2019 | Herr | |
| 10,389,361 B1 | 8/2019 | Powell, III et al. | |
| 10,554,207 B1 | 2/2020 | Herr et al. | |
| 10,615,783 B2 | 4/2020 | Powell, III et al. | |
| 10,650,319 B2 | 5/2020 | Medford | |
| 2003/0011398 A1 | 1/2003 | Herr | |
| 2003/0016069 A1 | 1/2003 | Furuta et al. | |
| 2003/0055513 A1 | 3/2003 | Raussendorf et al. | |
| 2004/0022332 A1 | 2/2004 | Gupta et al. | |
| 2005/0224784 A1 | 10/2005 | Amin et al. | |
| 2006/0290553 A1 | 12/2006 | Furuta et al. | |
| 2007/0077906 A1 | 4/2007 | Kirichenko et al. | |
| 2007/0174227 A1 | 7/2007 | Johnson et al. | |
| 2008/0186064 A1 | 8/2008 | Kirichenko | |
| 2008/0231353 A1 | 9/2008 | Filippov et al. | |
| 2009/0002014 A1 | 1/2009 | Gupta et al. | |
| 2009/0153180 A1 | 6/2009 | Herr | |
| 2009/0153381 A1 | 6/2009 | Kirichenko | |
| 2009/0289638 A1 | 11/2009 | Farinelli et al. | |
| 2009/0319757 A1 | 12/2009 | Berkley | |
| 2010/0033206 A1 | 2/2010 | Herr et al. | |
| 2011/0133770 A1 | 6/2011 | Przybysz et al. | |
| 2011/0267878 A1 | 11/2011 | Herr et al. | |
| 2012/0184445 A1 | 7/2012 | Mukhanov et al. | |
| 2013/0040818 A1 | 2/2013 | Herr et al. | |
| 2014/0118024 A1 | 5/2014 | Eastin | |
| 2014/0223224 A1 | 8/2014 | Berkley | |
| 2015/0094207 A1 | 4/2015 | Herr et al. | |
| 2015/0254571 A1 | 9/2015 | Miller et al. | |
| 2016/0013791 A1 * | 1/2016 | Herr | H03K 3/38 326/5 |
| 2016/0034609 A1 | 2/2016 | Herr et al. | |
| 2016/0125102 A1 | 5/2016 | Shauck et al. | |
| 2016/0164505 A1 | 6/2016 | Naaman et al. | |
| 2016/0189053 A1 | 6/2016 | Alboszta et al. | |
| 2017/0359072 A1 | 12/2017 | Hamilton et al. | |
| 2019/0149139 A1 | 5/2019 | Braun | |
| 2020/0106444 A1 | 4/2020 | Herr et al. | |

FOREIGN PATENT DOCUMENTS

| | | | |
|---|---|---|---|
| JP | S58135141 | A | 8/1983 |
| JP | S60163487 | A | 8/1985 |
| JP | H08148989 | A | 6/1996 |
| JP | 2006165812 | A | 6/2006 |
| JP | 2012064622 | A | 3/2012 |
| JP | 2013529380 | A | 7/2013 |
| WO | 2008089067 | | 7/2008 |
| WO | 2016007136 | A1 | 1/2016 |
| WO | 2018075106 | A1 | 4/2018 |

OTHER PUBLICATIONS

Non Final Office Action for U.S. Appl. No. 16/051,102 dated Sep. 11, 2019.

Jian Li, et al., "Dynamical Autler-Townes control of a phase qubit", Scientific Reports, vol. 2, Dec. 11, 2012, XP055268241, DOI: 10.1038/srep00654 *p. 1-p. 6, right-hand column, paragraph 2*.

Jerger M, et al., "Frequecy division multiplexing readout and simultaneous manipulation of an array of flux quibts", Applied Physics Letters, AIP Publicsing LLC, US, vol. 101, No. 4, Jul. 23, 2012, pp. 42604-42604, XP012164086, ISSN: 0003-6951, DOI: 10.1063/1.4739454 [retrieved on Jul. 27, 2012]*pp. 042604-1-pp. 042604-3*.

Jian Le, et al, "Operation of a phase qubit as a quantum switch", Arxiv.org, Cornell University Library, 201 Olin Library Cornell University Ithaca, NY 14853, Mar. 14, 2011, SF080543914, DOI: 10.1038/SREP00645 *pae 1—p. 3, right-hand column, paragraph 3*.

Dicarlo L, et al., "Demonstration of Two-Qubit Algorithms with a Superconducting Quantum Porcessor", Arxiv.org, Cornell University Library, 201 Olin Library Cornell University Ithaca, NY 14853, Mar. 11, 2009, XP080314862, DOI: 10.1038/NATURE08121 *the whole document*.

A. Laucht, et al., "electrically controlling single-spin qubits in a continuous microwave field", Science, vol. 1, No. 3 Apr. 10, 2015, pp. e150002-e1500022, XP055267170. US ISSN: 0036-8075, DOI: 10.14126/sciadv.1500022 *the whole document*.

Japanese Office Action for Application No. 2018-549958 dated Oct. 8, 2019.

Australian Examination Report for Application No. 2017345039 dated Oct. 9, 2019.

International Search Report for International Application No. PCT/US2019/040372 dated Dec. 5, 2019.

European Search Report for Application No. EP 19 18 7630 dated Oct. 4, 2019.

Invitation to Pay Additional Fees for Application No. PCT/US2019/040297 dated Nov. 15, 2019.

European Examination Report corresponding to European Patent Application No. 14 830 748.1 dated Mar. 15, 2019.

Rylyakov, A.: http://www.physics.sunysb.edu/Physics/RSFQ/Lib/AR/dff.html.

Korean Office Action Corresponding to KR Application No. 10-2017-7021776 dated Mar. 18, 2019.

U.S. Office Action corresponding to U.S. Appl. No. 15/886,652, dated May 24, 2018.

International Search Report for International Application No. PCT/US2018056293 dated Apr. 2, 2019.

Examination Report for Australian Patent Application No. 2018229427 dated Jun. 5, 2019.

(56) References Cited

OTHER PUBLICATIONS

International Search Report for PCT/US2019/015233 dated Apr. 25, 2019.
Wezawa M et al: "Pulse-driven dual-rail logic gate family based on rapid single-flux-quantum (RSFQ) devices for asynchronous circuits", Advanced Research in Asynchronous Circuits and Systems, 1996. Proceedings., Second International Symposium on Fukushima, Japan 18-21 Mar. 1, Los Alamitos, CA, USA, IEE Comput. Soc, US, Mar. 18, 1996, pp. 134-142, XP010159627, DIO:10.1109/SYNC.1996.494445 ISBN: 978-0-8186-7298-9 the whole document.
International Search Report for PCT/US2019/015228 dated Apr. 25, 2019.
Examination Report for Australian Application No. 2017237713 dated Apr. 26, 2019.
Non Final Office Action for U.S. Appl. No. 16/051,058 dated Jun. 3, 2019.
Okabe, et al., "Boolean Single Flux Quantum Circuits", IEICE Transactions on Electronics, Institute of Electronics, Tokyo, JP, vol. E84-C, No. 1, Jan. 1, 2001, pp. 9-14, XP001003211, ISSN: 0916-8524, Sections 3.2 and 3.4; figures 5, 11.
Grajcar et al, "Direct Josephson coupling between superconducting flux qubits", Arxiv.org, Cornell University Library, 201 Olin Library Cornell. University Ithaca, NY 14853, Jan. 5, 2005, XP080187009, DOI: 10.1103/PHYSERVB.72.020503, figure 5.
International Search Report for PCT/US2019/014803 dated Jun. 6, 2019.
International Search Report for PCT/US2019/015229 dated Jun. 18, 2019.
Bacon et al., "Adiabatic Gate Teleportation", Arxiv.org, Cornell University Library, 201 Olin Library Cornell University Ithaca, NY 14853 (Mar 6, 2009), doi: 10.1103/PHYSERVLETT.103.120504, Claims 1-20.
Australian Examination Report for Application No. 2017345039 dated Jul. 8, 2019.
European Office Action for Application No. 17 706 655.2-1203 dated Jul. 3, 2019.
International Written Opinion and Search Report corresponding to International Application No. PCT/US2018/056310 dated Jan. 22, 2019.
International Written Opinion and Search Report corresponding to International Application No. PCT/US2018/056316 dated Jan. 25, 2019.
International Written Opinion and Search Report corresponding to International Application No. US/PCT2018/056305 dated Jan. 30, 2019.
Narendran, S. et al.: "Quantum computation based on Reciprocal Quantum logic", 2017 International Conference on Nextgen Electronic Technologies; Silicon to Software (ICNETS2), IEEE, Mar. 23, 2017 (Mar. 23, 2017), pp. 34-37 Retrieved on Oct. 13, 2017. p. 25, right hand column, paragraph 1; figures 6,7.
Kotani S. et al.: "Ultrahigh-speed logic gate family with Nb/Al-A10 x / Nb Josephson junctions", IEEE Transactions on Election Devices, vol. 33, No. 3, Mar. 1, 1986 (Mar. 1, 1986), pp. 379-384.
Likharev, K.K. et al.: "RSFQ Logic/Memory Family: A New Josephson-Junction Technology for Sub-Terahertz-Clock-Frequency Digital Systems," IEEE Transactions on Applied Superconductivity, vol. 1 No. 1, Mar. 1991.
Warren, R. H., "Gates for Adiabatic Quantum Computing", Cornell University Library, http://arxiv.org/ftp/arxiv/papers/1405/1405.2354.pdf, Aug. 26, 2014 (Aug. 26, 2014).
Canadian Office Action for Application No. 3,032,557 dated Jan. 24, 2020.
Barlett, S. D. et al., "Simple nearest-neighbor two-body", Physical Review A (Atomic, Molecular, and Optical, vol. 74, No. 4, pp. 40302-1, DOI: 10.1103/PHYSREVA.74.040302, Oct. 24, 2006 (Oct. 24, 2006).
Canadian Office Action for Application No. 3,032,085 dated Jan. 24, 2020.
Korean Office Action for Application No. 10-2018-7027661 dated Feb. 13, 2020.
Burm Baek et al., 'Hybrid superconducting-magnetic memory device using competing order parameters,' Nature Communications, vol. 5, May 2014.
Australian Examination Report for Application No. 2017321014 dated Jan. 28, 2020.
Richard H Warren: "Gates for Adiabatic Quantum Computing", Aug. 26, 2014 (Aug. 26, 2014), XP055438870.
European Office Action for Application No. 17 847 738.6 dated Jan. 16, 2020.
Rabi frequency https://en.wikipedia.org/wiki/Rabi_frequency (Year: NA).
The formula for the dot product in terms of vector components https://mathinsight.org/dot_product_formula_components (Year: NA).
Final Office Action for U.S. Appl. No. 14/616,473 dated Dec. 26, 2019.
Nowka, "High-Performance CMOS system Design Using Wave Pipelining", Sematantic Scholar, https://www.semanticscolar.org/paper/High-Perforrnance-CMOS-System-Design-Using-Wave-Nowka/a5ef4cd1e69cae058f162a9a8bf085b027d35f0c, Jan. 31, 1996 (Jan. 31, 1996).
Canadian Office Action for Application No. 3034016 dated Dec. 18, 2019.
Japanese Office Action for Application No. 2018-187270 dated Dec. 10, 2019.
Japanese Office Action for JP Application No. 2019-505506 dated May 20, 2020.

\* cited by examiner

RQL PHASE-MODE FLIP-FLOP

TECHNICAL FIELD

The present invention relates generally to quantum and classical digital superconducting circuits, and specifically to a reciprocal quantum logic (RQL) phase-mode flip-flop.

BACKGROUND

In the field of digital logic, extensive use is made of well known and highly developed CMOS (complimentary metal-oxide semiconductor) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins.

A flip-flop is a bistable multivibrator, a two-stable-state circuit that can therefore be used to store state information and to change state by signals applied to one or more control inputs. In modern computing and communications electronics, flip-flops are the basic storage element in sequential logic. A conventional D flip-flop, e.g., one implemented in CMOS, has two binary inputs, a data input D and a clock input, and at least one output, Q. The D flip-flop captures the value of the D input at a definite portion of an input clock cycle, e.g., a rising edge or a falling edge, known as the capture time. That captured value becomes the Q output. The output Q does not change except at the capture time (or some small propagation delay thereafter). In practical implementations it is required that a data input D be stable for some setup time prior to the capture time and for some hold time after the capture time for the input to be reliably captured and propagated to the output.

Phase-mode logic allows digital values to be encoded as superconducting phases of one or more JJs. For example, a logical "1" may be encoded as a high phase and a logical "0" may be encoded as a low phase. For example, the phases may be encoded as being zero (meaning, e.g., logical "0") or $2\pi$ (meaning, e.g., logical "1"). These values persist across RQL AC clock cycles because there is no requirement for a reciprocal pulse to reset the JJ phase.

SUMMARY

One example includes a reciprocal quantum logic (RQL) phase-mode flip-flop that includes a storage loop and a comparator. The storage loop receives a data input signal on a data input line as positive or negative single flux quantum (SFQ) pulse and stores the data input signal in the storage loop. The comparator receives a logical clock input signal on a logical clock input line and compares the received logical clock input signal with the stored data input signal. The flip-flop further has an output signal line that transmits an output signal corresponding to a logical "1" or logical "0" value based on comparison, e.g., as a positive or negative SFQ pulse based on the data input signal as read substantially during a time of a logical clock input signal. By "substantially during times of logical clock input signals," it is meant that setup and hold times, including negative hold times, if applicable, are accounted for. The output pulse can correspond to a 0 or $2\pi$ quantum phase of an output Josephson junction (JJ).

Another example includes a method of writing and reading a logical value to and from an RQL flip-flop. In the method, a data input SFQ pulse that is one of either positive or negative is provided to a data input of an RQL flip-flop. A storage loop in the RQL flip-flop is set from a ground state to a state that is the one of either positive or negative. A reciprocal SFQ pulse pair is provided to a clock input of the RQL flip-flop. An output signal corresponding to a logical "1" or logical "0" value is transmitted out of an output of the RQL flip-flop. The output signal can be, e.g., an SFQ pulse that is the one of either positive or negative. The storage loop is returned to the ground state.

Another example includes an RQL phase-mode flip-flop that includes a data signal input to a storage loop and a logical clock signal input to a comparator. The storage loop has a data input JJ between an input node and a low-voltage rail, a storage inductor between the input node and an output node, and an output JJ between the output node and the low-voltage rail. The comparator has a clock input inductor and an escape JJ arranged in series between a logical clock input node and the output node, and also includes the output JJ.

DETAILED DESCRIPTION

This disclosure relates generally to quantum and classical digital superconducting circuits, and specifically to a reciprocal quantum logic (RQL) phase-mode flip-flop. The RQL phase-mode flip-flop can be implemented, for example, in a memory system (e.g., a quantum computing memory system) to store a logic state of an addressed memory cell. As an example, the inputs and the output can each be provided via a Josephson transmission line (JTL), such as in an RQL superconducting circuit.

An RQL phase-mode flip-flop can include a storage loop and a comparator, each of which can include Josephson junctions (JJs). A data input, which can be provided as a positive or negative single flux quantum SFQ pulse, can be stored in the storage loop to set the storage loop in a positive or negative state, respectively, effectively biasing an output JJ that can be shared between the storage loop and a comparator. The data input can be captured to the output upon the receipt of a logical clock SFQ reciprocal pulse pair to the comparator, when one of the pulses in the pair can cause the output JJ to preferentially trigger over an escape JJ in the comparator, owing to the output JJ having been biased by current in the storage loop.

Figure 1:
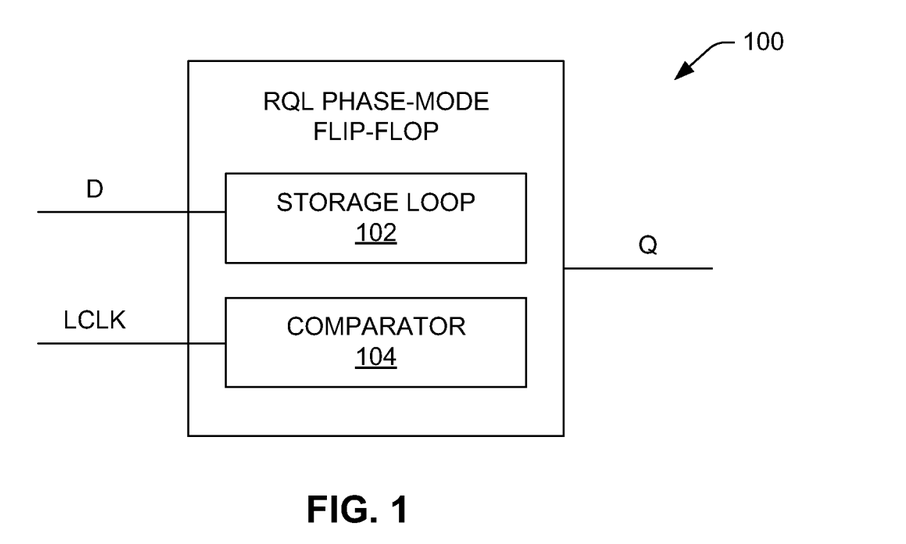
FIG. 1 is an example block diagram of an RQL phase-mode flip-flop.

FIG. 1 is an example block diagram of an RQL phase-mode flip-flop 100 having data input D, logical clock input LCLK, and output Q. The D and LCLK inputs and Q output follow the traditional flip-flop nomenclature described above, with logical clock input LCLK being the equivalent of an AC clock CLK in a CMOS flip-flop. Logical clock input LCLK can provide an SFQ signal and should not be confused with an RQL AC clock that may be used to provide reciprocal clock signals in an RQL system. Flip-flop 100 can include storage loop 102 configured to receive a data input signal from data input D and store it. Storage loop 102 can be configured to have three possible states, a ground state, a positive state, and a negative state. Flip-flop 100 can further include comparator 104 configured to receive a logical clock input signal from logical clock input LCLK and render a comparison between the received logical clock input signal and a stored data input signal, i.e., the state of the storage loop.

The combined function of storage loop 102 and comparator 104 can provide output Q. For example, flip-flop 100 can be configured such that if the storage loop is in the positive state and a positive signal is received on the logical clock input signal, output Q is asserted to its logical "1" value; and if the storage loop is in the negative state and a negative signal is received on the logical clock input signal, output Q is de-asserted to its logical "0" value. In such an example, any other combination of signals will have no effect on the logical state of output Q. Thus, for example, any received logical clock input signal, whether positive or negative, will not change the logical state of output Q when the storage loop is in its ground state; a negative logical clock signal will not de-assert output Q when the storage loop is in its positive state; and a positive logical clock signal will not assert output Q when the storage loop is in its negative state.

For example, SFQ pulses arriving at input D can consist of alternating positive and negative pulses consistent with RQL phase-mode data encoding. Multiple pulses can be allowed to arrive between assertions of the LCLK input. These successive pulses can serve to alternate the state of the internal storage loop 102 between the ground state and the positive state if the last output at Q was a logical "0" or between the ground state and the negative state if the last output at Q was a logical "1." Only the state of the storage loop 102 when LCLK is asserted affects the output Q.

Each of storage loop 102 and comparator 104 can have at least one JJ. For example, storage loop 102 can have two JJs arranged in a loop, such that the direction of a current through the loop, or the absence of such current, determine which of the three aforementioned states the storage loop is in. Also for example, comparator 104 can have two JJs that are directly connected to each other. The JJs in comparator 104 can be configured such that each time an SFQ pulse input comes in on logical clock input LCLK, only one of the two JJs in comparator 104 will trigger, and input D determines which of the two JJs in comparator 104 will trigger. Storage loop 102 and comparator 104 may also share a JJ, such that one of the JJs in storage loop 102 is also one of the JJs in comparator 104.

The logic value of flip-flop 100 can be stored, for example, as the superconducting phase of a JJ. For example, the logic value of flip-flop 100 can be stored as the phase of a JJ that is shared between storage loop 102 and comparator 104. As an example, a 0 phase of the JJ can encode a logic "0" value and a $2\pi$ phase of the JJ can encode a logic "1" value, but other combinations can work equally well.

Figure 2:
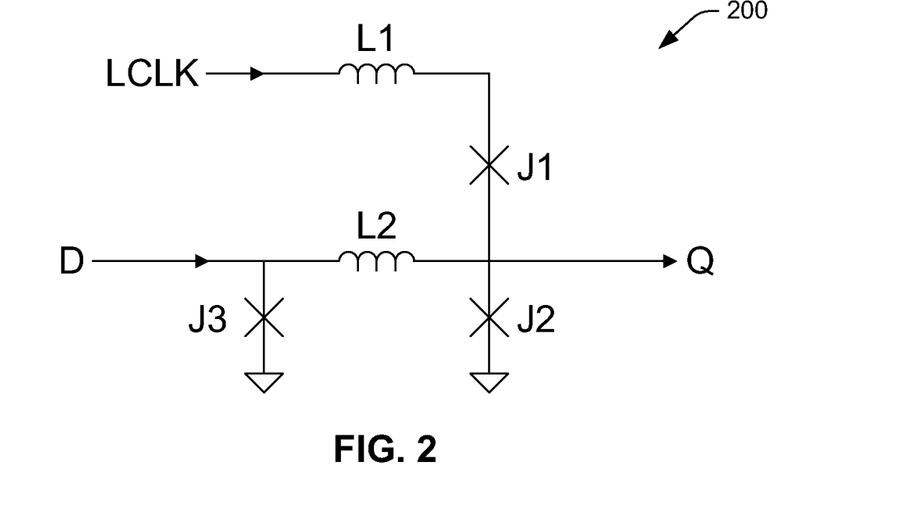
FIG. 2 is an example circuit diagram of an RQL phase-mode flip-flop.

FIG. 2 is an example circuit diagram of an efficient RQL phase-mode D flip-flop 200 that can correspond to the flip-flop 100 shown in FIG. 1. Flip-flop 200 can include three JJs J1, J2, J3 and two inductors L1, L2. An input signal from data input D triggers data input JJ J3 and stores a superconducting current in a storage loop formed by data input JJ J3, storage inductor L2, and output JJ J2. This storage loop can correspond to storage loop 102 in FIG. 1. The storage loop is connected, at the bottom of FIG. 2, by a low-voltage rail, e.g., a ground node. Owing to the comparatively large size of storage inductor L2, the current stored there will not be enough to trigger output JJ J2 on its own. Thus, an LCLK signal is required to "clock" the D input by triggering output JJ J2 (output JJ J2 having been biased by current in the storage loop) and thus to provide an output signal to output Q.

In some examples comparator JJs J1 and J2 can each be configured to exhibit critical currents between 30 microamperes and 55 microamperes, e.g., between 35 microamperes and 50 microamperes. Data input JJ J3 may be configured to exhibit a critical current at a larger current, e.g., between 55 microamperes and 65 microamperes, e.g., 60 microamperes. Storage inductor L2 may be configured to have an inductance value between 25 picohenries (pH) and 40 pH, e.g., between 30 pH and 35 pH. Storage inductor L2 and data input JJ J3 can be configured such that the product of the inductance of L2 and critical current of J3 is between 1.4 and 2.0 mApH. Comparator JJs J1 and J2 can be configured to exhibit critical currents similar to each other. Comparator JJs J1 and J2 need not exhibit critical currents at exactly the same currents, but comparator JJs J1 and J2 can be close in critical current size to one another, e.g., within 10% of each other.

The storage loop comprising data input JJ J3, storage inductor L2, and output JJ J2 has three possible states, a ground state where there is no current in the storage loop, a positive state where there is one single flux quantum $\Phi_0$ (e.g., $\Phi_0$=2.07 mA-pH) of current circulating in the clockwise direction, and a negative state where there is one $\Phi_0$ of current circulating in the counter-clockwise direction. Storage inductor L2 is sized to be relatively large such that in the positive and negative states, the induced current is insufficient to trigger storage loop JJs J2 or J3 even when combined with any AC bias leaking in from the surrounding JTLs. Input D is used to induce current in this storage loop. Positive pulses on input D, which can be driven nonreturn-to-zero (NRZ), induce clockwise current in the storage loop, and negative pulses on input D induce counter-clockwise current in the storage loop.

Comparator JJs J1 and J2 of flip-flop 200 form a comparator that can correspond to comparator 104 of FIG. 1. Escape JJ J1 can be configured to have a smaller critical current than output JJ J2. The current in the storage loop can be used to adjust the biasing of output JJ J2. The input of logical clock LCLK can be used to trigger the comparator and read out the state of the storage loop to output Q. The logical clock LCLK can be driven with a return-to-zero (RZ) pulse pair.

In the ground state of the storage loop formed by data input JJ J3, storage inductor L2, and output JJ J2, there is no current in the storage loop. In this state, any pulses, positive or negative, arriving from the logical clock input LCLK trigger the escape JJ J1. This destroys the incoming LCLK pulse and leaves the state of both the storage loop and the output Q of flip-flop 200 unchanged. As such, any positive-negative pulse pair from LCLK has no effect when the storage loop is in the ground state. Despite the three states of the storage loop, the flip-flop has only two states, corresponding to binary logical values "0" and "1", as encoded by the phase of output JJ J2, either 0 or $2\pi$.

Figure 3A:
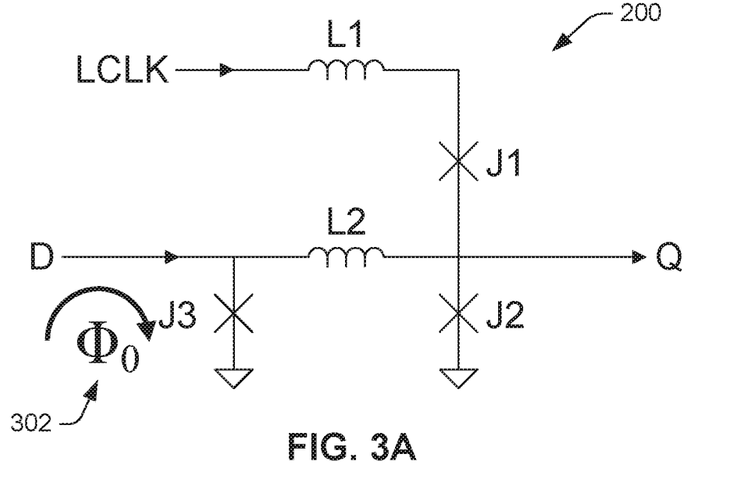
FIGS. 3A-3D illustrate an example operation of an RQL phase-mode flip-flop to write and read a logical "1" value.
Figure 3B:
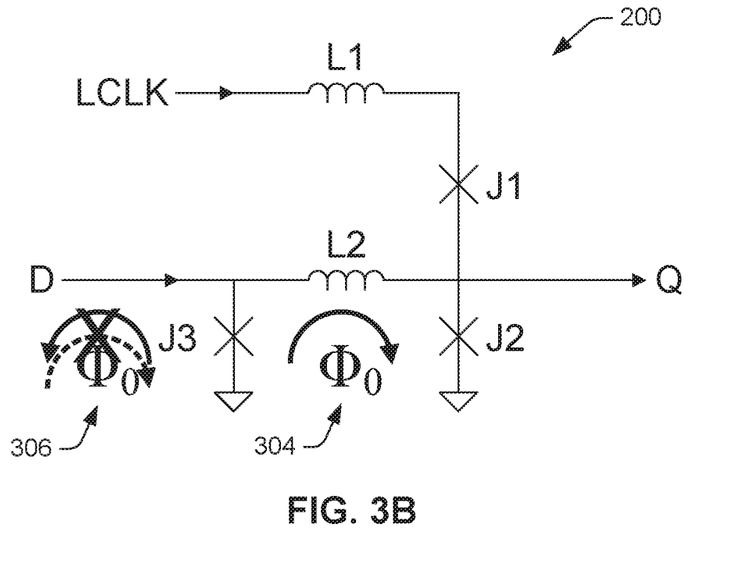

FIGS. 3A-3B illustrate a sequence showing the writing of a logical "1" value to the flip-flop 200. FIG. 3A shows the input D asserted with a positive SFQ pulse 302, causing data input JJ J3 to switch, i.e., from a 0 phase to a $2\pi$ phase. As shown in FIG. 3B, this switching puts one $\Phi_0$ of current 304 into the storage loop in the clockwise direction and also cancels 306 the incoming pulse from input D. Current loop 304 can be thought of as the result of a phase differential between J3 and J2, J3 having a $2\pi$ phase while J2 still has a 0 phase. Because of the presence and direction of superconducting current 304, the storage loop is now in the positive state. This positive state of the storage loop preferentially biases output JJ J2 towards switching in the positive direction.

Figure 3C:
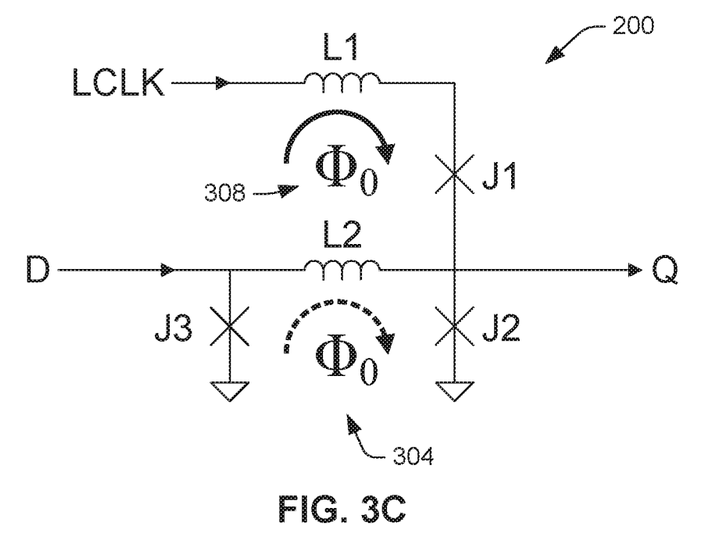
Figure 3D:
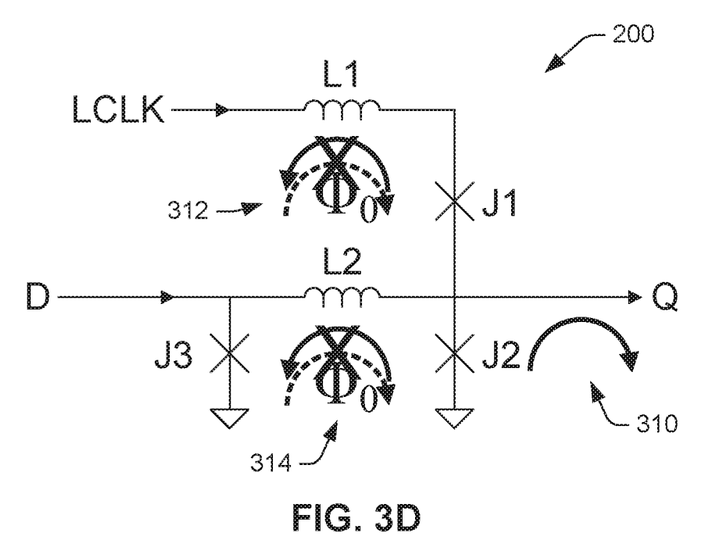

FIGS. 3C-3D illustrate a sequence showing the reading of the stored logical "1" value from the flip-flop 200. Following from the state shown in FIG. 3B, a reciprocal pulse pair is input via the LCLK input. When the positive pulse 308 arrives, as shown in FIG. 3C, it puts current through comparator JJs J1 and J2 and clock input inductor L1. Because output JJ J2 has been preferentially biased by the current 304 in the storage loop, it will now trigger instead of escape JJ J1. As shown in FIG. 3D, this will, in turn, drive a positive SFQ pulse in all directions away from output JJ J2 through the node connecting comparator JJs J1 and J2. Thus, in FIG. 3D, the triggering of output JJ J2 will drive a positive SFQ pulse 310 out of the output Q, asserting it. Additionally, it will cancel both the currents through escape JJ J1 and clock input inductor L1, 312, as well as the clockwise current in the storage loop, 314. Thus, the output Q has now been asserted and the storage loop has been returned to the ground state. When the negative pulse of the reciprocal pulse pair is driven into the LCLK input (not shown), the circuit 200 is in ground state and the escape JJ J1 triggers, destroying the pulse without affecting the output or state of the storage loop.

The triggering of output JJ J2 shown in FIG. 3D as the result of the positive logical clock input SFQ pulse 308 in FIG. 3C changes the phase of output JJ J2 from 0 to $2\pi$, which phase persists even with a return pulse opposite to output pulse 310 that arrives as the result of the triggering of a first JJ in a JTL to which output Q may be connected (not shown). Thus, although current 310 may be destroyed, the $2\pi$ phase of output JJ J2 encoding the logical "1" value of flip-flop 200 remains.

Figure 4A:
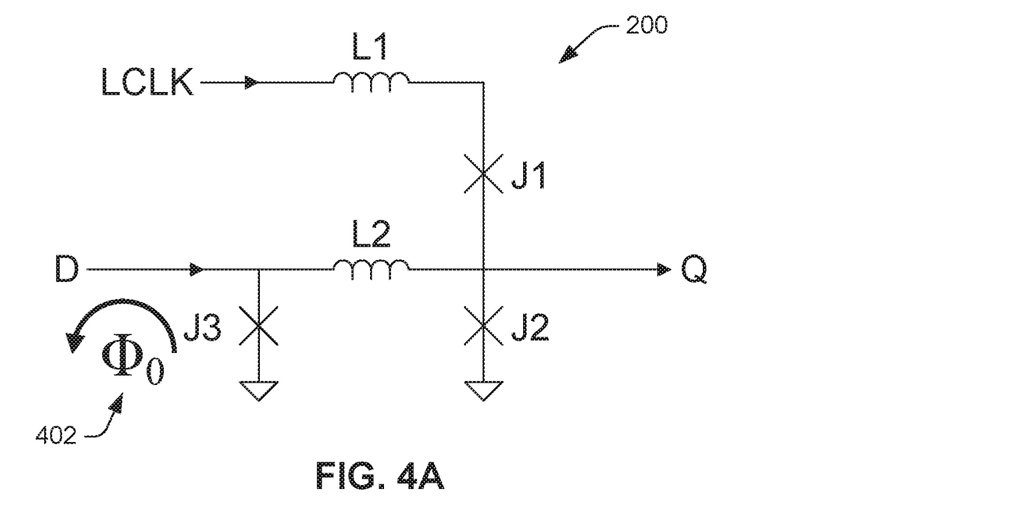
FIGS. 4A-4D illustrate an example operation of an RQL phase-mode flip-flop to write and read a logical "0" value.
Figure 4B:
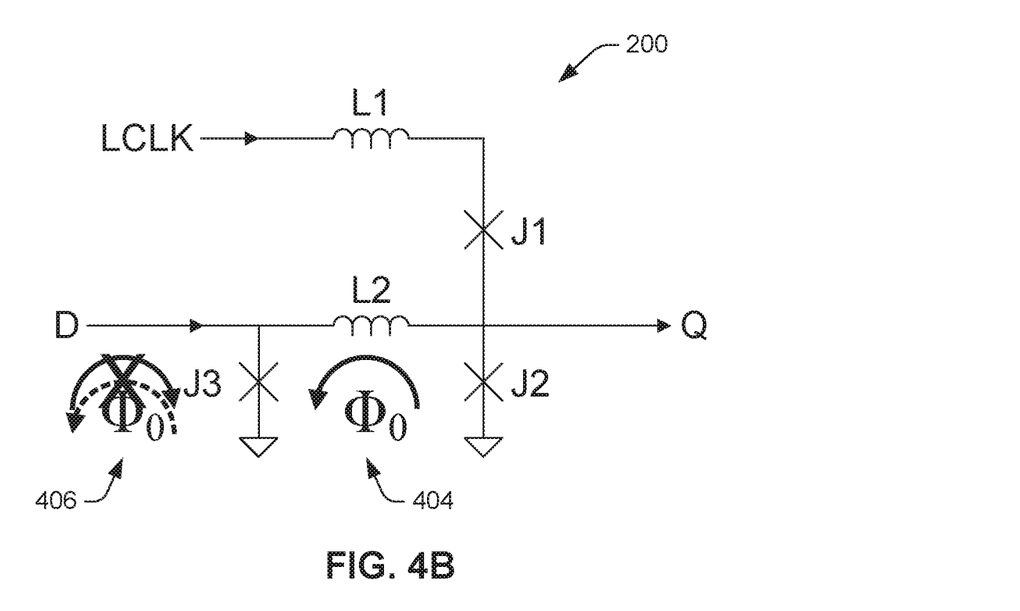

FIGS. 4A-4B illustrate a sequence showing the writing of a logical "0" value to the flip flop 200. FIG. 4A shows the input D driven with a negative SFQ pulse 402, causing data input JJ J3 to switch, i.e., from a $2\pi$ phase back to a 0 phase. As shown in FIG. 4B, this switching puts one $\Phi_0$ of current 404 into the storage loop in the counter-clockwise direction and also cancels 406 the incoming pulse from input D. Current loop 404 can be thought of as the result of a phase differential between J2 and J3, J2 having a $2\pi$ phase while J3 now has a 0 phase. Because of the presence and direction of superconducting current 404, the storage loop is now in the negative state. This preferentially biases output JJ J2 towards switching in the negative direction.

Figure 4C:
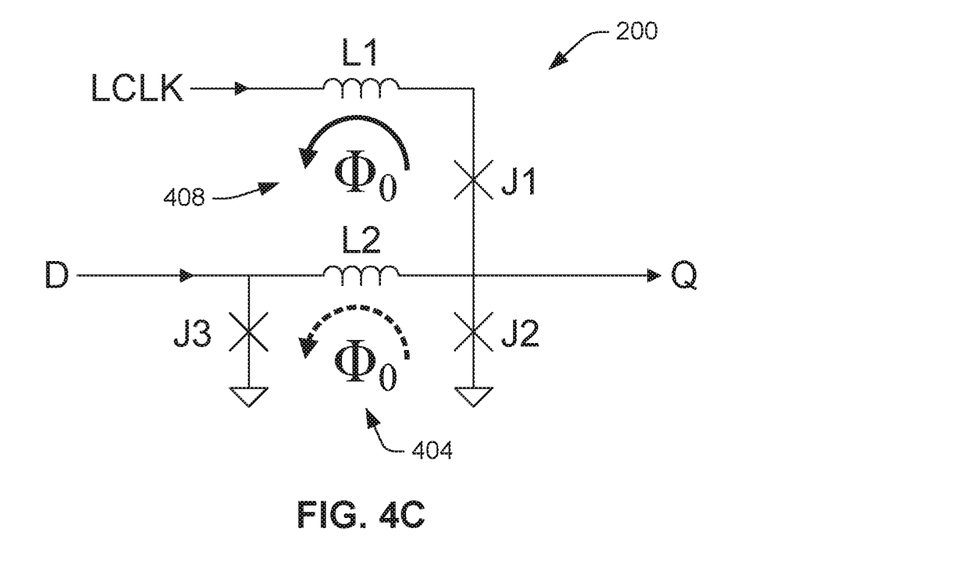
Figure 4D:
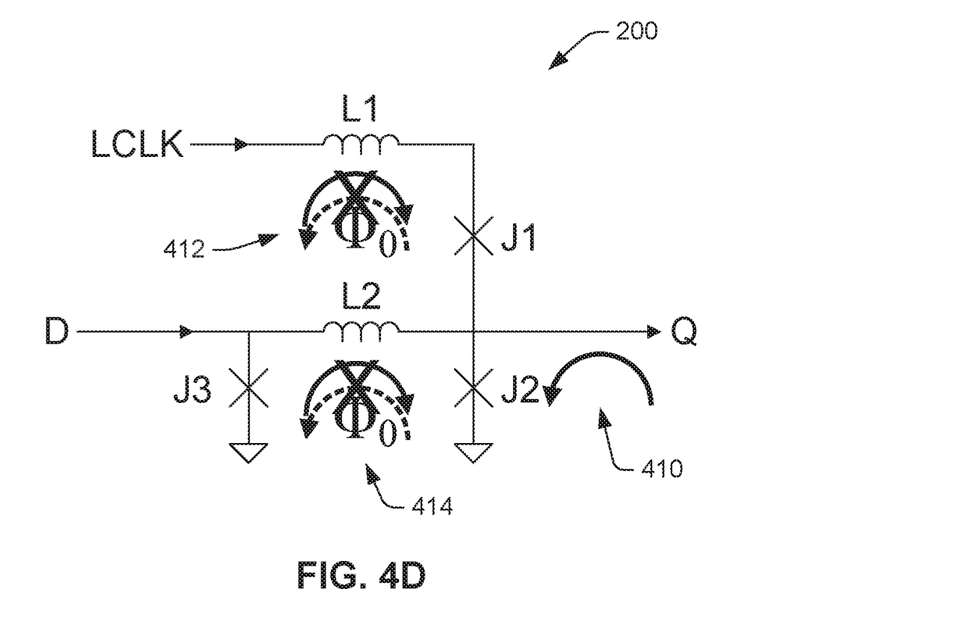

FIGS. 4C-4D illustrate a sequence showing the reading of the stored logical "0" value from the flip-flop 200. Following from the state shown in FIG. 4B, a reciprocal pulse pair is input via the LCLK input. When the positive pulse arrives (not shown), escape JJ J1 triggers, destroying the pulse without affecting the output or state of the storage loop. When the negative pulse 408 arrives, as shown in FIG. 4C, it puts current through comparator JJs J1 and J2 and clock input inductor L1. Because output JJ J2 has been preferentially biased by the current 404 in the storage loop, it will now trigger instead of escape JJ J1. As shown in FIG. 4D, this will, in turn, drive a negative SFQ pulse in all directions away from output JJ J2 through the node connecting comparator JJs J1 and J2. Thus, in FIG. 4D, the triggering of output JJ J2 will drive a negative SFQ pulse 410 out of the output Q, de-asserting it. Additionally, it will cancel both the currents through escape JJ J1 and clock input inductor L1, 412, as well as the counter-clockwise current in the storage loop, 414. The flip-flop 200 has now returned to the ground state.

The triggering of output JJ J2 shown in FIG. 4D as the result of the negative logical clock input SFQ pulse 408 in FIG. 4C changes the phase of output JJ J2 from $2\pi$ to 0, which phase persists even with a return pulse opposite to output pulse 410 that arrives as the result of the triggering of a first JJ in a JTL to which output Q may be connected (not shown). Thus, although current 410 may be destroyed, the 0 phase of output JJ J2 encoding the logical "0" value of flip-flop 200 remains.

As noted previously with respect to the example of FIG. 1, each time an SFQ pulse input comes in on logical clock input LCLK, one and only one of the comparator JJs J1 or J2 will trigger, and input D determines which of comparator JJs J1 or J2 will trigger. If input D has not put any current into the storage loop, or has effectively destroyed any current from the storage loop by supplying an opposite pulse, any inputs on LCLK will trigger escape JJ J1 alone, effectively rejecting such LCLK inputs, and no output is created on Q. If input D has put a current into the storage loop, thus changing the bias condition of output JJ J2, and because output JJ J2 will see current stored in that loop but escape JJ J1 does not, output JJ J2 will preferentially trigger and generate output on Q. In arrangement 200, when comparator JJs J1 and J2 are close to the same size, and when there is no current in the storage loop, escape JJ J1 will trigger first, because it sees all of the current from input LCLK, whereas output JJ J2 sees only most of such current, since some of such current will leak out through the storage loop and output Q given that each branch emanating from the node connecting comparator JJs J1 and J2 together form an inductive network in parallel.

Flip-flop 200 is a "phase-mode" flip-flop inasmuch as the logic value of flip-flop 200 is stored as the superconducting phase (either 0 or $2\pi$) of output JJ J2, i.e., the JJ that is shared between the storage loop of flip-flop 200 and the comparator of flip-flop 200. Flip-flop 200 is efficient in terms of its use of devices, requiring only three JJs and two inductors, apart from any devices used for race condition avoidance phasing of input signals.

Figure 5:
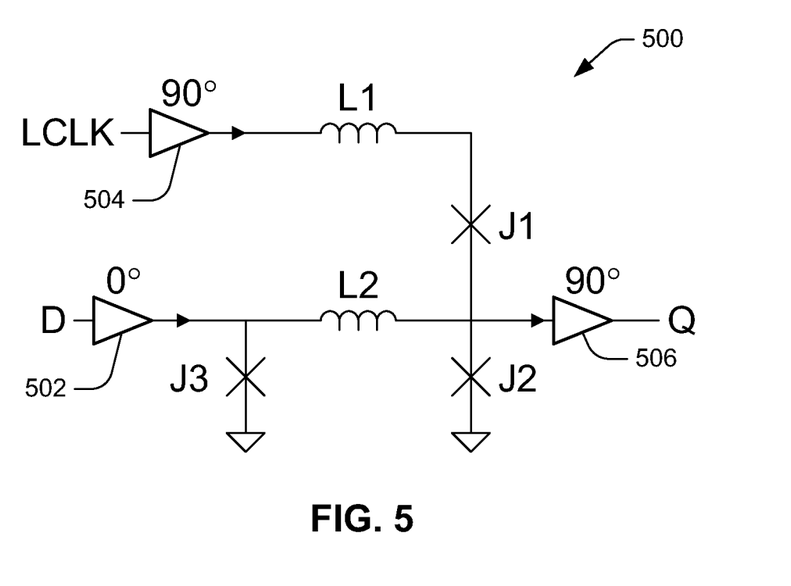
FIG. 5 is an example circuit diagram of an RQL phase-mode flip-flop.

Because there may exist setup and hold requirements on the input D relative to the input LCLK, applying a 90° phase offset between the inputs can improve performance of the flip-flop 200 in terms of timing. Here "phasing" and "phase offset" refer to the timing of the supplied AC waveforms, not the superconducting phases (0 or $2\pi$) of individual JJs. FIG. 5 illustrates an example flip-flop circuit 500 that corresponds to circuit 200 but with input delay buffer 504 configured to delay a logical clock signal relative to the input timing 504 of input D. The indicated delay buffers 502, 504, 506 may be, for example, Josephson transmission lines (JTLs). The state of the internal loop formed by data input JJ J3, storage inductor L2, and output JJ J2—whether ground, positive, or negative—at the time the LCLK pulses arrive determines what state will be read out to output Q. Thus any new input must arrive prior to the LCLK pulses. Particularly, positive SFQ pulses at D must arrive prior to positive SFQ pulses at LCLK and negative SFQ pulses at D must arrive prior to negative SFQ pulses at LCLK. Using a delay buffer (e.g., JTLs) to drive the input D that has a phase assignment 90° ahead of the one at the LCLK input and Q output, as shown in FIG. 5, can help enforce setup requirements. Similar phasing schemes, not shown and too numerous to list, can likewise assist in meeting the setup and hold requirements and thus to avoid undesirable race conditions where an LCLK signal arrives before an intended D signal resulting in the capturing and output of wrong data. As examples, the buffers (e.g., JTLs) could be respectively configured such that input D has a phase assignment 180° or 270° ahead of the LCLK input.

A notable consequence of the above-described setup and hold requirements is that it can be possible to assert the clock with a consistent waveform at input D that will affect no value change at the output regardless of whether the current output value is a logical "0" or a logical "1." To accomplish this, the last arriving input pulse at D prior to the positive pulse of input LCLK must have been a negative pulse and the last arriving input pulse at D prior to the negative pulse of LCLK must have been a positive pulse.

Figure 6:
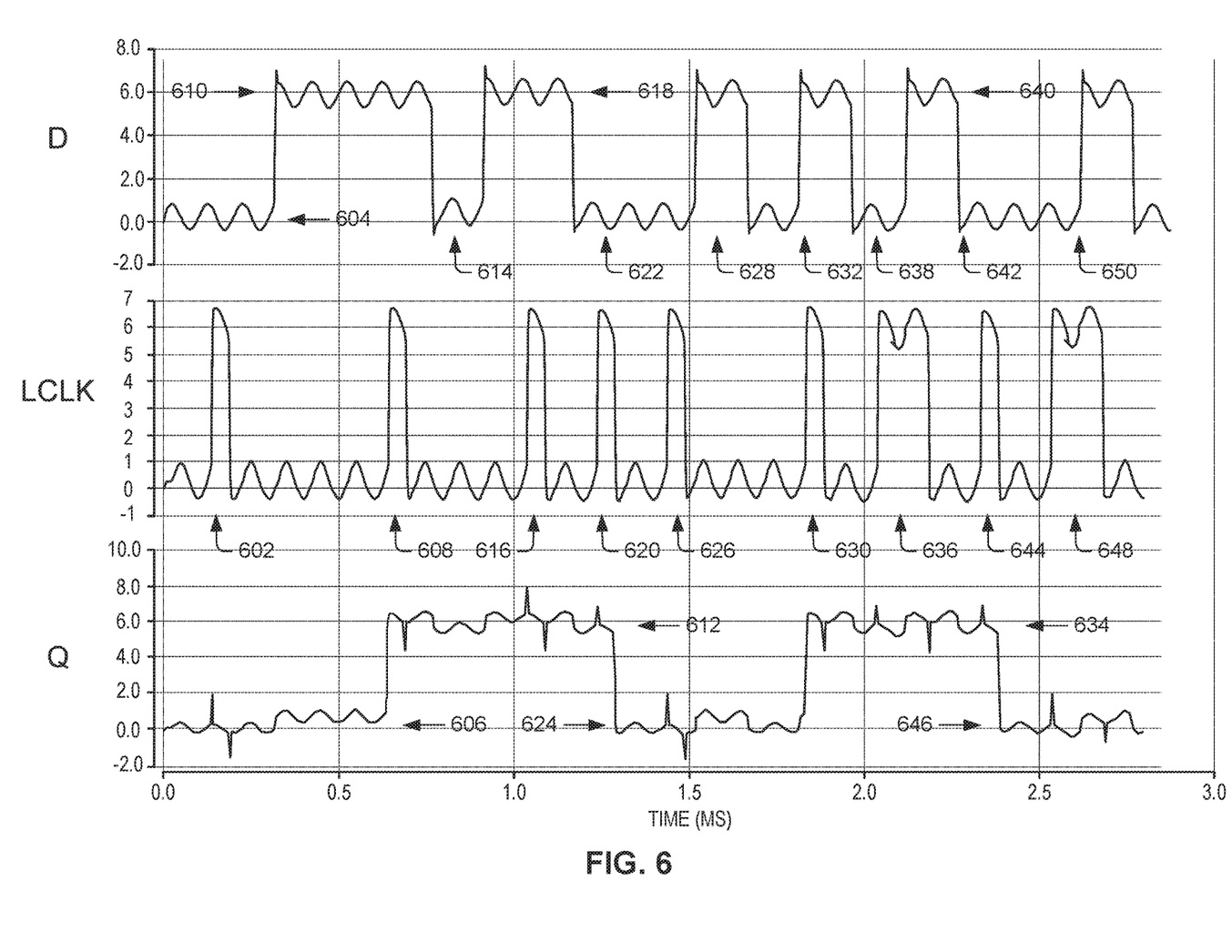
FIG. 6 is an example timing example diagram of an RQL phase-mode flip-flop.

FIG. 6 is an example timing diagram plotted in terms of superconducting phase, derived from analog simulation, demonstrating the functioning of an RQL phase-mode flip-flop of the previous examples. Except those at 636 and 648, LCLK signals consist of pulse pairs comprising a positive SFQ pulse followed very close in time by a negative SFQ pulse, e.g., separated by roughly 180°. Logical value changes in D signals can be spaced arbitrarily further apart in time than this. Tiny transients that may be noted in Q signals not effecting a logical value change in Q signals and corresponding to pulses on LCLK may result, for example, from the triggering of escape JJ J1 in circuit 200 as shown in FIG. 2. The latching behavior of the flip-flop is exemplified as shown.

LCLK pulse pair 602 made while input D is logical "0" 604 before, during, and after the LCLK pulse pair 602 results in no change in output Q from its logical "0" value 606. However, when LCLK pulse pair 608 is made while input D is logical "1" 610, and specifically on the positive pulse of the pulse pair 608, Q is asserted to a logical "1" 612, which is not changed by the transition of D to a logical "0" 614 in absence of a logical clock pulse pair or by LCLK pulse pair 616 once D has returned to its logical "1" value 618. However, on the reciprocal (negative) pulse of LCLK pulse pair 620, when D is again logical "0" 622, Q is de-asserted to a logical "0" 624, which is not changed by LCLK pulse pair 626 made while D is still logical "0" 622 or by the transition of D to a logical "1" 628 in absence of a logical clock pulse pair.

LCLK pulse pair 630, made very shortly in time after the transition of D from logical "0" to logical "1" 632, results in output Q being asserted to logical "1" because the setup time requirement was nonetheless met. LCK pulse pair 636 has the positive pulse and negative pulse being more distant in time from each other than the previous pulse pairs 602, 608, 616, 620, 626, 630. Even though the positive pulse of the pulse pair 626 arrives while D is briefly logical "0" 638, i.e., while a "0" value has been briefly written to the flip-flop, because only a negative pulse on LCLK can de-assert output Q to read out a "0" input on D to Q, and because D returns to logical "1" 640 prior to the negative pulse of pulse pair 636, the "1" output 634 at Q remains unchanged. From this result it can also be concluded that the hold time requirement for the logical "0" 638 on D was not met, i.e., D's "0" value 638 was not held long enough for the negative pulse of LCLK pulse pair 636 to translate the input to an output. The hold time is met, however, when D next goes logical "0" 642, and the negative pulse of LCLK pulse pair 644 sends output Q to a logical "0" once again 646.

Like LCLK pulse pair 363, LCLK pulse pair 648 is also protracted in time. That the positive pulse of pulse pair 648, while D is still logical "0," has no effect on the logical "0" value 646 of output Q may be unremarkable. However, Q is still unaffected from its logical "0" value 646 when input D again rises to logical "1" 650 during the pendency of LCLK pulse pair 648. This is because a falling edge of LCLK, i.e., the negative pulse of an LCLK pulse pair, can only de-assert Q to logical "0," and cannot serve as the capture time for a logical "1" signal. It can be concluded that the setup time requirement for the logical "1" on D was not met, i.e., the signal sending input D positive 650 arrived after the positive pulse of LCLK pulse pair 648 and was not sent to the output Q.

Figure 7:
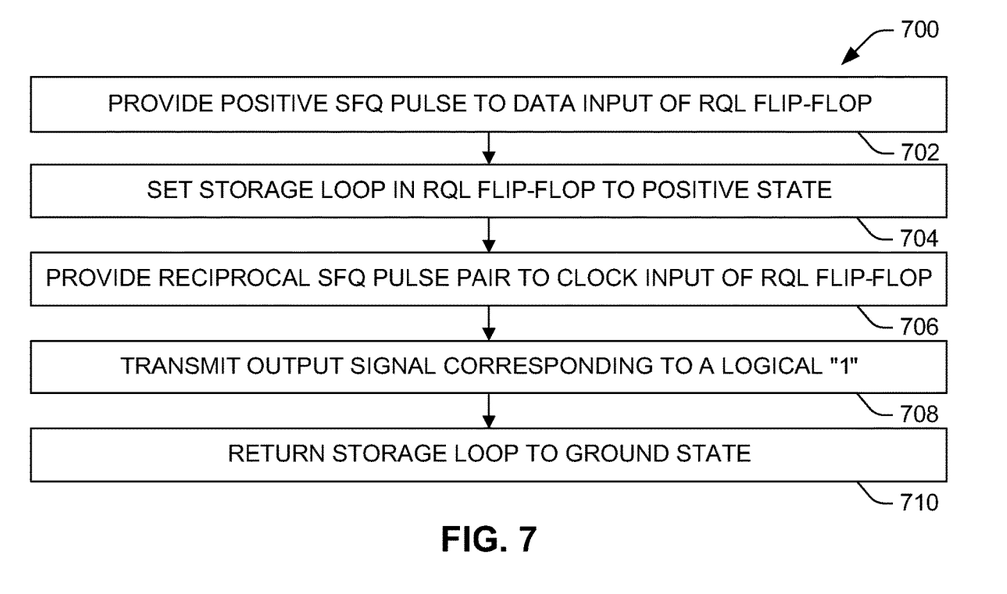
FIGS. 7-9 are flow charts showing methods of writing and reading values to and from an RQL phase-mode flip-flop.

FIG. 7 illustrates a method 700 of writing and reading a logical "1" value to and from an RQL flip-flop 200. A positive SFQ pulse provided 702 to a data input of an RQL flip-flop, such as to data input D of flip-flop 100 in FIG. 1 or flip-flop 200 in FIG. 2, sets 704 a storage loop, such as storage loop 102 illustrated in FIG. 1, into a positive state, e.g., by putting one single flux quantum of current into the storage loop in a first direction. A reciprocal SFQ pulse pair provided 706 to a clock input of the RQL flip-flop, such as clock input LCLK of flip-flop 100 in FIG. 1 or flip-flop 200 in FIG. 2, induces the transmitting 708 of an output signal corresponding to a logical "1" value out of an output of the RQL flip-flop, asserting it, e.g., by driving a positive SFQ pulse out of the output of the RQL flip-flop, and returns 710 the storage loop to the ground state.

Figure 8:
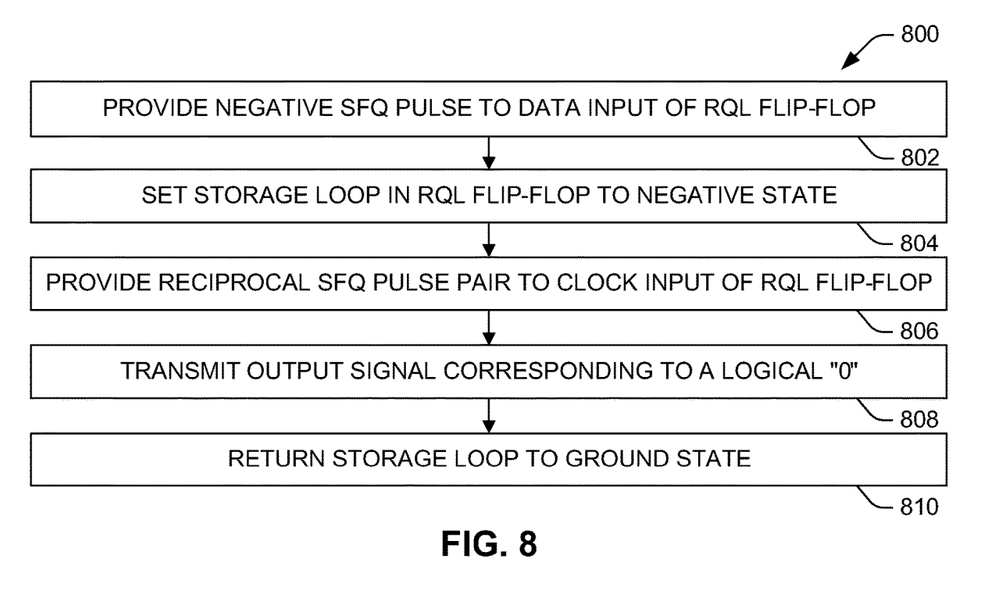

FIG. 8 illustrates a method 800 of writing and reading a logical "0" value to and from an RQL flip-flop. A negative SFQ pulse provided 802 to a data input of an RQL flip-flop, such as to data input D of flip-flop 100 in FIG. 1 or flip-flop 200 in FIG. 2, sets 804 a storage loop, such as storage loop 102 illustrated in FIG. 1, into a negative state, e.g., by putting one single flux quantum of current into the storage loop in a second direction that is counter to the aforementioned first direction. A reciprocal SFQ pulse pair provided 806 to a clock input of the RQL flip-flop, such as clock input LCLK of flip-flop 100 in FIG. 1 or flip-flop 200 in FIG. 2, induces the transmitting 808 of an output signal corresponding to a logical "0" value out of an output of the RQL flip-flop, de-asserting it, e.g., by driving a negative SFQ pulse out of the output, and returns 810 the storage loop to the ground state.

Figure 9:
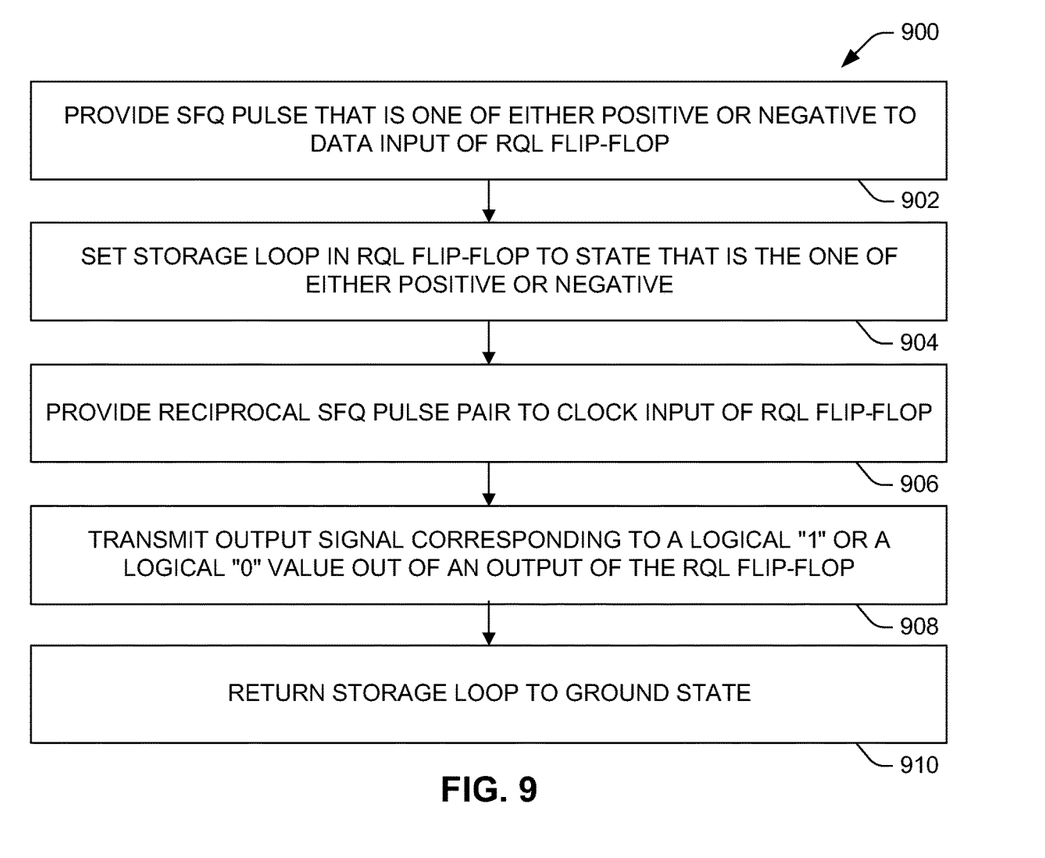

The methods shown in FIGS. 7 and 8 can be generalized to a single method of writing and reading a logical value to and from an RQL flip-flop. As shown in FIG. 9, such a method 900 includes providing 902 a data input SFQ pulse that is one of either positive or negative to a data input of an RQL flip-flop; setting 904 a storage loop in the RQL flip-flop from a ground state to a state that is the one of either positive or negative; providing 906 a reciprocal SFQ pulse pair to a clock input of the RQL flip-flop; transmitting 908 an output signal corresponding to a logical "1" or logical "0" value out of an output of the RQL flip-flop, e.g., by driving an output SFQ pulse that is the one of either positive or negative out of an output of the RQL flip-flop; and returning 910 the storage loop to a ground state. If the "one of either positive or negative" for each action is positive, a logical "1" value can be said to have been written and read, whereas if the "one of either positive or negative" is negative, a logical "0" value can be said to have been written and read. Because the designation of "1" and "0" as assigned to positive or negative states may be arbitrary in the context of the logic of the larger system in which the flip-flop is implemented, the logical values may be inversed in some examples, e.g., negative input and output pulses might encode logical "1" whereas positive input and output pulses might encode logical "0." The output can be based on the data input and the logical clock input.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A reciprocal quantum logic (RQL) phase-mode flip-flop comprising:
   a tri-stable storage loop configured to receive a data input signal on a data input line as positive or negative single flux quantum (SFQ) pulse and to store the data input signal in the storage loop, the storage loop being configured to contain one of $-\Phi_0$, zero, or $+\Phi_0$ of current;
   a comparator configured to receive a logical clock input signal on a logical clock input line and to compare the received logical clock input signal with the stored data input signal; and
   an output signal line configured to transmit an output signal corresponding to a logical "1" or logical "0" value based on the comparison.

2. The flip-flop of claim 1, wherein the output signal is a negative or positive SFQ pulse corresponding to a 0 or $2\pi$ quantum phase of an output Josephson junction.

3. The flip-flop of claim 1, wherein the storage loop comprises two Josephson junctions and a storage inductor arranged in the loop.

4. The flip-flop of claim 3, wherein one of the two Josephson junctions is an output Josephson junction arranged between the output signal line and a low-voltage rail, and the other of the two Josephson junctions is a data input Josephson junction arranged between the data input line and the low-voltage rail.

5. The flip-flop of claim 1, wherein the comparator comprises two Josephson junctions sized to have about equal critical currents.

6. The flip-flop of claim 1, wherein the comparator comprises:
   a clock input inductor and an escape Josephson junction arranged in series between the logical clock input line and the output signal line; and
   an output Josephson junction arranged between the output signal line and a low-voltage rail;
   wherein the escape Josephson junction is sized such that it preferentially triggers before the output Josephson junction in the absence of additional biasing of the output Josephson junction.

7. The flip-flop of claim 6, wherein the comparator is configured such that the comparison between the received logical clock input signal and the stored data input signal comprises one and only one of the escape Josephson junction and the output Josephson junction triggering in response to an SFQ pulse received as the logical clock input signal.

8. The flip-flop of claim 7, wherein the comparator is configured such that that the comparison between the received logical clock input signal and the stored data input signal comprises the output Josephson junction preferentially triggering to generate the output signal based on a positive or negative bias condition on the output Josephson junction resulting from a current in the storage loop corresponding to the data input signal.

9. The flip-flop of claim 1, wherein the storage loop and the comparator share a Josephson junction arranged between the output signal line and a low-voltage rail.

10. A method of writing and reading a logical value to and from a reciprocal quantum logic (RQL) flip-flop, the method comprising:
   providing a data input single flux quantum (SFQ) pulse that is one of either positive or negative to a data input of an RQL flip-flop;
   setting a tri-stable storage loop in the RQL flip-flop from a ground state to a state that is the one of either positive or negative, the storage loop being configured to contain one of $-\Phi_0$, zero, or $+\Phi_0$ of current, corresponding respectively to the negative, ground, and positive states;
   providing a reciprocal SFQ pulse pair to a clock input of the RQL flip-flop;
   transmitting an output signal corresponding to a logical "1" or logical "0" value out of an output of the RQL flip-flop, the output signal being based on the state of the storage loop; and
   returning the storage loop to the ground state.

11. The method of claim 10, wherein the setting the storage loop state comprises triggering a data input Josephson junction in the storage loop to establish a current in the storage loop, the direction of which corresponds to whether the data input SQF pulse is positive or negative.

12. The method of claim 11, wherein the current in the storage loop established by the setting the storage loop state is insufficient to trigger an output Josephson junction in the storage loop.

13. The method of claim 10,
   wherein the data input SFQ pulse is positive; and
   wherein the providing the reciprocal SFQ pulse pair to the clock input comprises providing an SFQ clock pulse pair comprising a positive pulse and a negative pulse to the clock input, provided in either order,
      the positive pulse to the clock input triggering an output Josephson junction in the storage loop, thereby asserting the output, and
      the negative pulse to the clock input triggering an escape Josephson junction in series with the clock input and having a common node with the output Josephson junction, the triggering of the escape Josephson junction not affecting the state of the storage loop.

14. The method of claim 13, wherein the triggering of the output Josephson junction:

returns the storage loop to the ground state by canceling the current in the storage loop; and cancels a current through the escape junction created by the providing the positive SFQ clock pulse.

15. The method of claim 10, wherein the data input SFQ pulse is negative; and wherein the providing the reciprocal SFQ pulse pair to the clock input comprises providing an SFQ clock pulse pair comprising a positive pulse and a negative pulse to the clock input, provided in either order, the positive pulse to the clock input triggering an escape Josephson junction in series with the clock input and having a common node with an output Josephson junction in the storage loop, the triggering of the escape Josephson junction not affecting the state of the storage loop, and the negative pulse to the clock input triggering the output Josephson junction, thereby de-asserting the output.

16. The method of claim 15, wherein the triggering of the output Josephson junction:

returns the storage loop to the ground state by canceling the current in the storage loop; and cancels a current through the escape junction created by providing the negative SFQ clock pulse.

17. A reciprocal quantum logic (RQL) phase-mode flip-flop comprising:

a data signal input to a tri-stable storage loop, the storage loop being configured to contain one of $-\Phi_0$, zero, or $+\Phi_0$ of current, the storage loop comprising:

a data input Josephson junction (JJ) between an input node and a low-voltage rail;

a storage inductor between the input node and an output node; and an output JJ between the output node and the low-voltage rail;

a logical clock signal input to a comparator, the comparator comprising:

a clock input inductor and an escape JJ arranged in series between a logical clock input node and the output node; and the output JJ.

18. The flip-flop of claim 17, wherein the inductance value of the storage inductor is sufficiently large such that the current stored in the storage inductor from a single SFQ pulse that is one of either positive or negative, provided on the data signal input, will not trigger the output junction without another single SFQ pulse that is the one of either positive or negative being provided on the logical clock signal input.

19. A reciprocal quantum logic (RQL) phase-mode flip-flop comprising:

a storage loop configured to receive a non-return-to-zero (NRZ) data input signal on a data input line as positive or negative single flux quantum (SFQ) pulse and store the data input signal in the storage loop;

a comparator configured to receive a logical clock input signal on a logical clock input line and to compare the received logical clock input signal with the stored data input signal; and an output signal line configured to transmit an NRZ output signal corresponding to a logical "1" or logical "0" value based on the comparison.

20. A method of writing and reading a logical value to and from a reciprocal quantum logic (RQL) flip-flop, the method comprising:

providing a non-return-to-zero (NRZ) data input single flux quantum (SFQ) pulse that is one of either positive or negative to a data input of an RQL flip-flop;

setting a storage loop in the RQL flip-flop from a ground state to a state that is the one of either positive or negative;

providing a reciprocal SFQ pulse pair to a clock input of the RQL flip-flop;

transmitting an NRZ output signal corresponding to a logical "1" or logical "0" value out of an output of the RQL flip-flop, the output signal being based on the state of the storage loop; and returning the storage loop to the ground state.

* * * * *